(12) United States Patent
Rodriguez, Jr. et al.

(10) Patent No.: US 11,327,104 B2
(45) Date of Patent: May 10, 2022

(54) FAULT CIRCUIT INDICATOR APPARATUS, SYSTEM, AND METHOD

(71) Applicant: 3M INNOVATIVE PROPERTIES COMPANY, St. Paul, MN (US)

(72) Inventors: Ernesto M. Rodriguez, Jr., Georgetown, TX (US); Laszlo Markos, Jr., Austin, TX (US); Steven E. Turch, Blaine, MN (US); Shuguang Wu, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 17/250,571

(22) PCT Filed: Aug. 6, 2019

(86) PCT No.: PCT/IB2019/056694
§ 371 (c)(1),
(2) Date: Feb. 3, 2021

(87) PCT Pub. No.: WO2020/039288
PCT Pub. Date: Feb. 27, 2020

(65) Prior Publication Data
US 2021/0172991 A1    Jun. 10, 2021

Related U.S. Application Data

(60) Provisional application No. 62/721,025, filed on Aug. 22, 2018.

(51) Int. Cl.
*G01R 31/08* (2020.01)
*H04W 4/38* (2018.01)
*G01R 31/00* (2006.01)

(52) U.S. Cl.
CPC ......... *G01R 31/083* (2013.01); *G01R 31/003* (2013.01); *G01R 31/088* (2013.01); *H04W 4/38* (2018.02)

(58) Field of Classification Search
CPC .. G01R 31/083; G01R 31/003; G01R 31/088; H04W 4/38
See application file for complete search history.

(56) References Cited

U.S. PATENT DOCUMENTS

| 7,719,436 B2 | 5/2010 | Feight |
| 9,742,180 B2 | 8/2017 | Wentzel |

(Continued)

FOREIGN PATENT DOCUMENTS

| CN | 104253005 | 12/2014 |
| EP | 2947466 | 11/2015 |

OTHER PUBLICATIONS

International Search report for PCT Application No. PCT/IB2019/056694 dated Dec. 27, 2019, 4 pages.

(Continued)

*Primary Examiner* — Farhana A Hoque
(74) *Attorney, Agent, or Firm* — Gregg H. Rosenblatt

(57) ABSTRACT

A fault circuit indicator (FCI) detection system for electrical equipment disposed in an enclosure or vault having an above-ground vent pipe exhaust outlet comprises one or more sensors disposed in the enclosure or vault to sense a condition of at least one unit of the electrical equipment. A sensored analytics unit (SAU) is coupled to the sensors to receive sensor data and analyze the sensor data, the SAU generating a corresponding analyzed data signal that provides information related to a condition of the at least one unit of electrical equipment. A transceiver is disposed inside at least a portion of the vent pipe to receive the analyzed data signal, wherein the transceiver is configured to communicate the analyzed data signal. A visual indicator is disposed on or (Continued)

within the vent pipe comprising one or more visual indicators, such as LEDs, driven by a driving circuit board to provide a visual signal corresponding to the condition of the at least one unit of electrical equipment.

20 Claims, 5 Drawing Sheets

(56) References Cited

U.S. PATENT DOCUMENTS

| | | |
|---|---|---|
| 9,900,967 B2 | 2/2018 | Isaacs |
| 9,961,418 B2 | 5/2018 | Rodriguez, Jr. |
| 2009/0115426 A1 | 5/2009 | Muench, Jr. |
| 2012/0092965 A1 | 4/2012 | Zhou |
| 2013/0229735 A1 | 9/2013 | Rostron |
| 2016/0314679 A1 | 10/2016 | Dodds |
| 2017/0127156 A1* | 5/2017 | Rodriguez, Jr ........ G05B 15/02 |

OTHER PUBLICATIONS

Horstmann, "OPTO F 3.0/ OPTO F+E 3+0 Short-circuit indicator" product brochure, 3 pp.

Kamsula, "Design and implementation of a bidirectional visible light communication testbed", University of Oulu, 2015, 59 pp.

* cited by examiner

FAULT CIRCUIT INDICATOR APPARATUS, SYSTEM, AND METHOD

BACKGROUND

Current methods used to locate underground cable faults can be slow and labor intensive. Even relatively short outages can be used against utilities and lead to rate adjustments for customers, so a faster means of locating and fixing underground faults is needed.

An exemplary data communication system is described in U.S. Pat. No. 9,961,418.

However, there is still a need for communicating signals into and out of underground equipment vaults and other structures where underground equipment is located to verify a fault condition.

SUMMARY OF THE INVENTION

In one aspect of the invention, a fault circuit indicator (FCI) detection system for electrical equipment disposed in an enclosure or vault having an above-ground vent pipe exhaust outlet comprises one or more sensors disposed in the enclosure or vault to sense a condition of at least one unit of the electrical equipment. A sensored analytics unit (SAU) is coupled to the sensors to receive sensor data and analyze the sensor data, the SAU generating a corresponding analyzed data signal that provides information related to a condition of the at least one unit of electrical equipment. A transceiver is disposed inside at least a portion of the vent pipe to receive the analyzed data signal, wherein the transceiver is configured to communicate the analyzed data signal. A visual indicator is disposed on or within the vent pipe comprising one or more visual indicators, such as LEDs, driven by a driving circuit to provide a visual signal corresponding to the condition of the at least one unit of electrical equipment.

The above summary of the present invention is not intended to describe each illustrated embodiment or every implementation of the present invention. The figures and the detailed description that follows more particularly exemplify these embodiments.

BRIEF DESCRIPTION OF THE DRAWINGS

The invention will be described hereinafter in part by reference to non-limiting examples thereof and with reference to the drawings, in which.

Figure 1A:
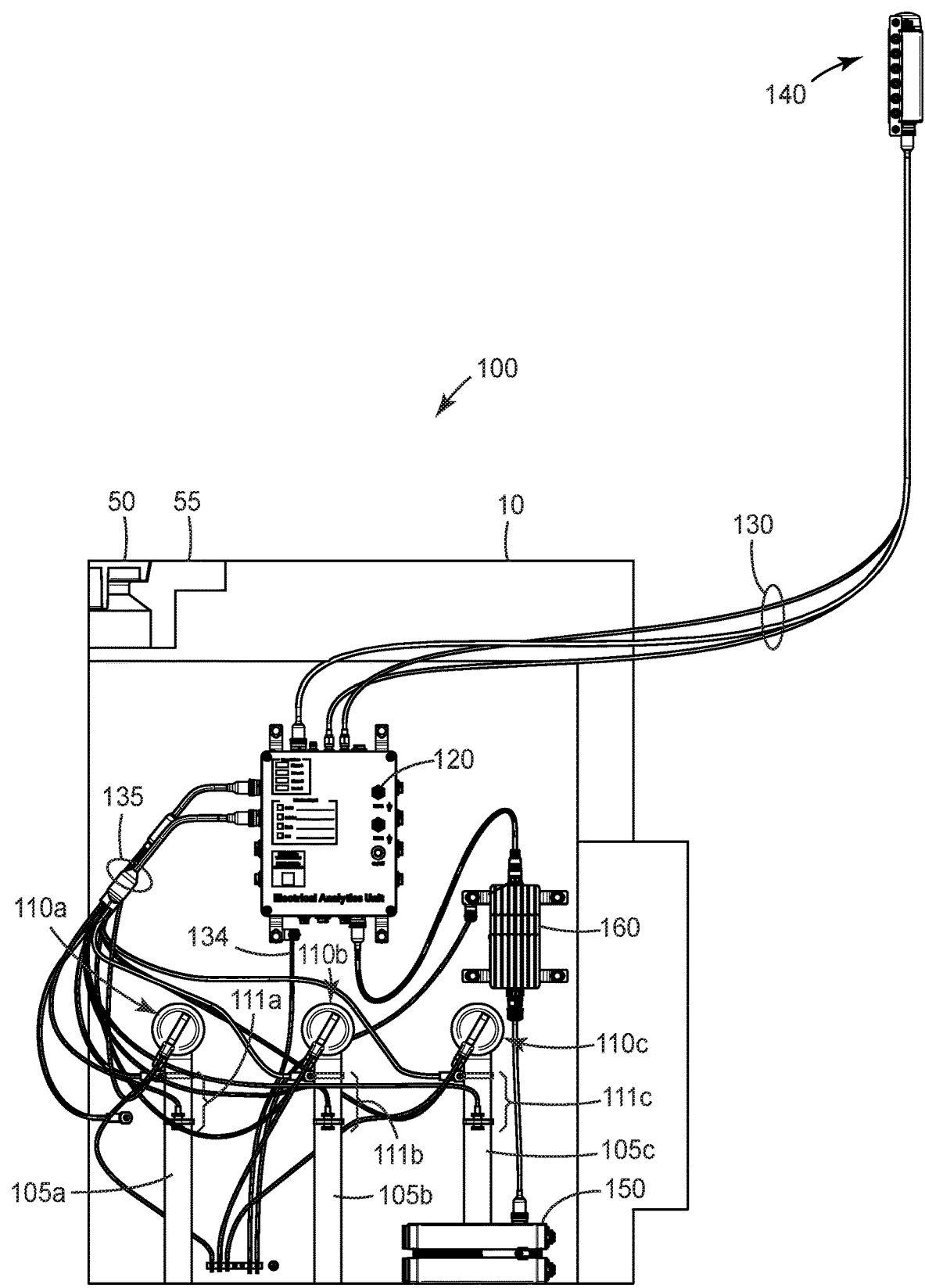
FIG. 1A is a schematic view of a fault circuit indicator detection system according to a first aspect of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A Fault Circuit Indication (FCI) detection apparatus, system, and method are described herein that can be utilized in an enclosure, such as a grade level, above ground or underground enclosure, that is used to house and protect utility assets, such as electrical equipment. In one aspect, the enclosure is an underground enclosure accessible via an entrance port and can include a separate vent pipe used to provide an exhaust outlet for gasses from the enclosure. The FCI detection apparatus or system can be installed within the enclosure/vent pipe to provide a means for communicating information about a condition, such as a fault or environmental condition, of the vault and or the utility asset disclosed therein. The communication can include a wireless communication, via a transceiver/antenna, and/or a visual communication, via a visible light indicator assembly, such as an LED array, disposed in or on the vent pipe. The mechanical packaging of the assembly and enclosure allows it to be installed into vent pipes at street level and is packaged for ingression protection. The antenna design allows it to transmit the signal through the vent pipe cover for security and anti-vandalism. The FCI detection apparatus or system can include one or more sensors that provide data related to a real-time condition within the enclosure. In addition, a sensor analytics unit can process and analyze the real-time data from the one or more sensors and relay that processed data to the transceiver for communication outside of the enclosure.

Thus, the FCI detection apparatus or system can provide a visual (local) or remote indication of a circuit fault on the electric power system. Combined with digital protective relays and recloser controls, the FCI detection apparatus or system can lead utility crews directly to the location of a fault, reducing power outage duration. While some traditional FCI systems use integral visual indicators (such as a target, lamp, LED, etc.) that carry very limited amount of information (trip vs. normal, permanent vs. temporary), the FCI detection apparatus or system described herein can provide a large amount of information through wireless communication.

FIG. 1A shows one aspect of the present invention, an FCI detection system 100. In this aspect, the FCI detection system 100 is installed in an underground enclosure, such as a vault or manhole, here underground vault 10. In this example implementation, enclosure or vault 10 includes a variety of equipment, such as switchgear for one or more high voltage electrical lines, such as electrical lines 105a-105c (carrying e.g., low, medium or high voltage power), associated components and/or accessories, such as a splice or termination (in the example of FIG. 1A, three terminations 110a-110c will represent such associated components and/or accessories). Of course, a fewer or greater number of components can be provided in a such an enclosure. In some enclosures, a transformer may be included therein.

The enclosure or vault 10 can be accessed from above ground via a portal or entrance port 55 that includes a conventional manhole cover 50, which can be formed from a metal or non-metal, and can have a conventional circular shape. In a one aspect, the manhole cover can be mounted on a ring, frame or flange structure 52 of the entrance port 55. In this aspect, vault 10 is can be constructed as a conventional underground vault, commonly used by electric, gas, water, and/or other utilities. However, in alternative aspects, the FCI detection system 100 can be utilized in another type of underground enclosure or similar structure, such as a manhole, basement, cellar, pit, shelter, pipe, or other underground enclosure.

The vault also includes at least one sensor or monitoring device disposed therein which can monitor a physical condition of the vault or of the components or equipment located in the vault. Such conditions would normally be difficult to gather or assess from above-ground. As described in detail below, the FCI detection system can provide a communication infrastructure to relay vault condition information (1) to an above ground network or SCADA, without having a service technician physically enter the vault to determine those conditions, (2) to an above ground technician via a wireless or Bluetooth communication system, and/or (3) via a visible light communication assembly to an observing technician.

In a further aspect, the FCI detection system can be implemented in an above ground environment. For example, FCI detection system 100 can be mounted within a grade level, pad mounted enclosure. The FCI detection system can provide a means of wirelessly communicating to and from a structure that is constructed in a manner that would otherwise prevent direct wireless communications to and from the interior portion of the structure. The components of the FCI Detection system 100 can be installed within the grade level, pad mounted enclosure in a manner consistent with the installation described herein.

As shown in FIG. 1A, in this example, terminations 110a-110c each provide a terminal connection for a power cable, such as a low, medium or high voltage power cable 105a-105c. The sensor(s) can include a sensor disposed on the termination. In this embodiment, sensors 111a-111c are provided. These sensors can provide sensing capabilities that measure a cable condition, such as voltage, current, and/or temperature. Thus, in this example, terminations 110a-110c can be referred to as sensored terminations 110a-110c that can provide real-time data about the condition of one or more connected power lines.

For example, one or more of the sensored terminations 110a-110c of this aspect can include one or more sensors 111a-111c. In one example, one or more sensors can comprise a Rogowski coil that produces a voltage that is proportional to the derivative of the current, meaning that an integrator can be utilized to revert back to a signal that is proportional to the current. Alternatively, a current sensor can be configured as a magnetic core current transformer that produces a current proportional to the current on the inner conductor. In addition, one or more of the sensored terminations can include a capacitive voltage sensor that provides precise voltage measurements. Because one or more of sensored terminations 110a-110c can include both a current sensor and a capacitive voltage sensor, the sensored terminations facilitate calculation of phase angle (power factor), Volt Amps (VA), Volt Amps reactive (VAr), and Watts (W). An exemplary sensored termination is described in U.S. Pat. No. 9,742,180, incorporated by reference herein in its entirety.

While the embodiment of FIG. 1A shows sensors implemented as part of a sensored termination, in other aspects of the invention, sensors can be implemented as part of a more general sensored electrical accessory, such as a cable termination, cable splice, or electrical jumper.

Thus, it is contemplated that one or more sensors can comprise one or more of the following sensors: power, voltage, current, temperature, combustible materials or byproducts of combustion, mechanical strain, mechanical movement (e.g. revolutions per minute), humidity, soil condition (acidity, moisture content, mineral content), pressure, hazardous atmosphere, liquid flow, leakage, component end-of-life or lifetime (e.g., a cathodic protection sensor), personnel presence (e.g., has someone entered the enclosure), physical state (e.g., is the enclosure open or closed, is the door open or closed, is a switch or valve open or closed, has an item been tampered with), light sensor, vibration (seismic, tampering).

Figure 1B:
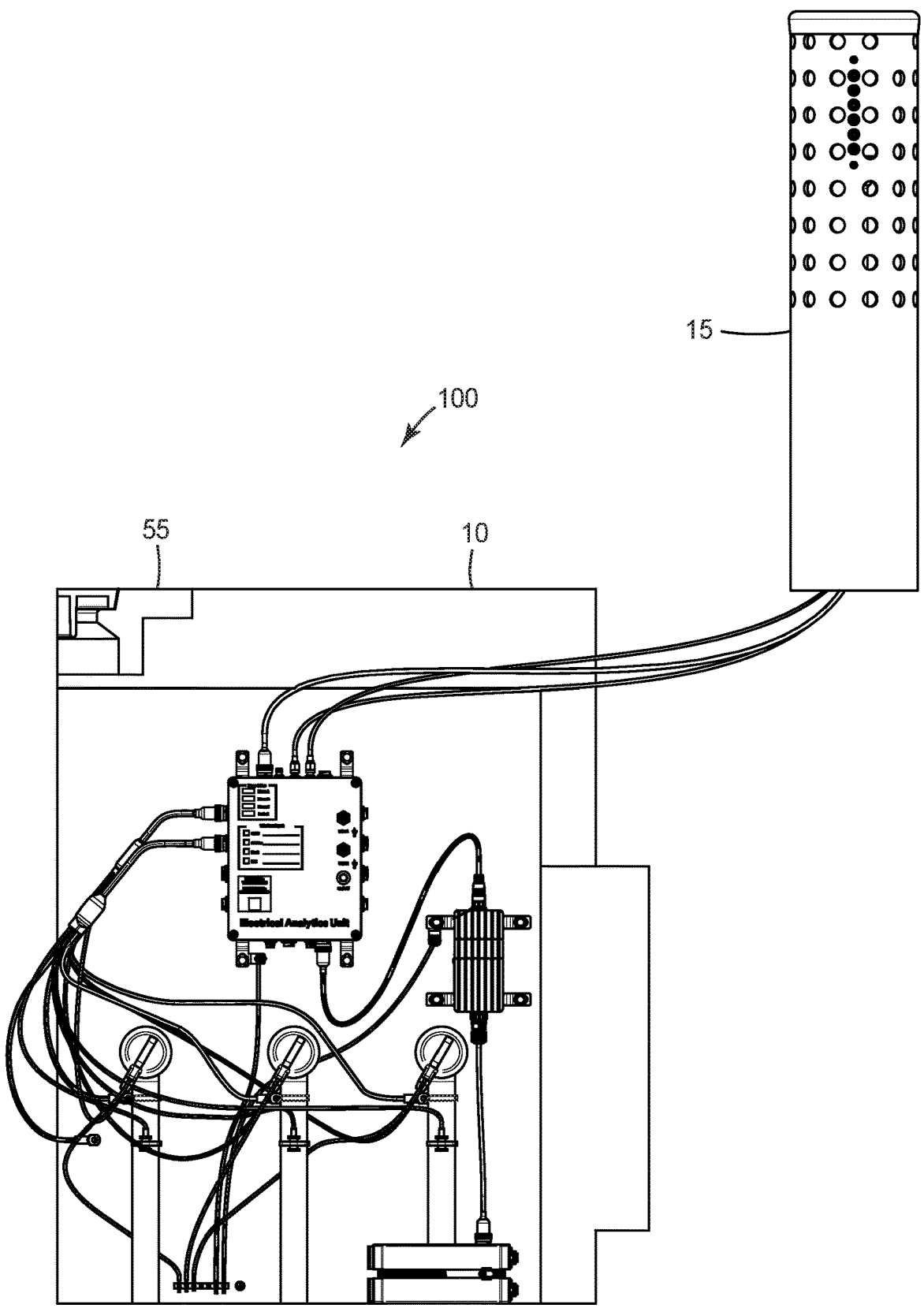
FIG. 1B is a schematic view of a fault circuit indicator detection system with the transceiver disposed in a vent pipe according to another aspect of the invention.

In another aspect of the invention, data is communicated from the sensors inside the enclosure to a network, SCADA, or service technician located outside the enclosure via a Sensor Analytics Unit (SAU) 120 and a transceiver 140. As explained in further detail below, the transceiver 140 can be incorporated in a transceiver device mounted in the vent pipe 15 (see FIG. 1B) located outside the enclosure 10, at, e.g., a distance of 2-10 meters away.

The SAU 120 can perform local analysis and interpretation of data from the sensors and communicate that analyzed data, via a radio disposed therein, to the antenna of the transceiver 140. The SAU 120 includes an integrated GPS circuit or chip to generate GPS locations signals to the GPS antenna located in the transceiver antenna unit. The integration of GPS capabilities along with time synch events leads to finding key problems with early detection with set thresholds and algorithms for a variety of incipient applications/faults/degradation of key structural or utility components.

For example, the SAU 120 can interpret sensor information to determine environmental conditions such as the presence of hazardous gases, moisture, dust, chemical composition, corrosion, pest presence, and more. In addition, the SAU 120 can perform some local actions, such as the opening and closing of switches. Further, the SAU 120 can send aggregated information such as periodic status or asynchronous alarm notifications upstream to another aggregation node and/or to the transceiver, which can forward that information to a cloud server above ground. The SAU 120 can also respond to messages sent to it by an upstream aggregation node or cloud (e.g., SCADA) service. Typical commands from an upstream node or cloud service can include "transmit status," "perform action," "system management," "data logging," "set configuration parameter," "load software," etc.

As shown in FIG. 1A, in this example, data from the sensored terminations 110a-110c can be communicated via one or more communication cables 135 (here with multiple cables connected to each sensored termination) to SAU 120.

In addition, a series of ground wires 134 can also be provided. The SAU 120 can be mounted at a central location within the enclosure or vault 10, or along a wall or other internal vault structure. In an embodiment of the invention, SAU 120 can include a gateway unit (not separately shown). Alternatively, the gateway unit can be disposed within the transceiver 140 or configured as a stand-alone component.

In a further alternative, the SAU 120 can be disposed in the vent pipe 15, with extended cables connecting to the one or more sensors disposed within the vault or enclosure. In this alternative aspect, the vent pipe-mounted SAU can be easily accessed by a technician without having to enter the vault or enclosure, or without having to open the entrance port or manhole cover.

The SAU 120 can include appropriate electronics, such as a digital signal processor (DSP) or system on a chip (SOC), to receive, manipulate, analyze, process, or otherwise transform such data signals into signals useable in a supervisory control and data acquisition (SCADA) system. In addition, the DSP can perform some operations independently of the SCADA. For example, the DSP can perform fault detection, isolation, location and condition monitoring and reporting. Moreover, the DSP/SAU can be programmed to provide additional features, such as Volt, VAR optimization, phasor measurement (synchnophaser), incipient fault detection, load characterization, post mortem event analysis, signature waveform identification and event capture, self-healing and optimization, energy auditing, partial discharge, harmonics/sub-harmonics analysis, flicker analysis and leakage current analysis.

As mentioned above, SAU 120 is adapted to process data signals received from sensors 111a-111c and transform such data signals into analyzed data signals which are useable in a supervisory control and data acquisition (SCADA) system. In addition, SAU 120 can also be adapted to receive signals from the SCADA system (via the transceiver 140) to control one or more components or equipment located in the vault. As shown in FIG. 1, data can be communicated between SAU 120 and a transceiver unit 140 (described below) via cable(s) 130, which can comprise one or more conventional cables, such as coaxial cable(s). In addition, power to the transceiver can also be delivered from the SAU via cable(s) 130.

In another aspect, SAU 120 can be configured as a modular or upgradeable unit. Such a modular unit can allow for dongle or separate module attachment via one or more interface ports. For example, multiple sensors can be connected to SAU 120. Such a configuration can allow for the monitoring of power lines and/or a variety of additional environmental sensors which can detect parameters such as gas, water, vibration, temperature, oxygen-levels, etc.). For example, in one alternative aspect, such an additional sensor can comprise a thermal imaging camera to observe a temperature profile of the environment and components within the enclosure. The aforementioned DSP/other chips can provide computational capabilities to interpret, filter, activate, configure, and/or communicate to the transceiver. Dongle or connector blocks can house additional circuitry to create an analog to digital front end. The dongle or connector blocks can also include a plug-n-play electrical circuit for automatically identifying and recognizing the inserted sensing module (and automatically set up proper synchronization, timing, and other appropriate communication conditions).

In another aspect of the invention, the SAU 120 can be implemented with a wireless network radio/transmitter/receiver. Example wireless networks that can be used in an underground location include any combination of WiFi, ZigBee, ANT, Bluetooth, infrared, and others. Thus, SAU 120 can be configured to communicate wirelessly with transceiver 140 and/or the sensors/monitoring devices and/or equipment located in vault 10. This equipment can include sensored terminations or any of the other sensor types previously mentioned with added wireless communication capability.

Further, the SAU 120 can include one or more radios, such as cellular modem, UHF radio (e.g., 900 MHz band), 2.4 GHz, 5.8 GHz, or wifi-mesh, for transmission of the analyzed data through the transceiver antenna to a network SCADA or a service technician outside the enclosure.

The FCI detection system 100 further includes a transceiver unit 140 that communicates information from (and to) the sensored termination(s) 110/SAU 120 to (and from) the above ground SCADA or wireless communications network. In addition, the transceiver unit 140 further includes a visual communication device or system 145 (see FIG. 2).

Optionally, the FCI detection system 100 can further include a power harvesting device/power harvester 150 (only a portion of which is shown in FIG. 1A), such as a conventional power harvesting device. The power harvester 150 can be used if there is no available AC or DC power source in the enclosure. Alternatively, equipment may be run via AC or DC power sources already located in the enclosure 10, such as potential transformers.

In an alternative aspect, the power harvesting device can be integrated as part of a sensored cable accessory to provide sufficient power for the SAU. The power harvesting device utilized in this aspect of the invention can be constructed in a manner similar to, for example, the energy harvesting devices described in EP Patent Publication No. EP 2947466, incorporated by reference in its entirety. In this example construction, an energy harvesting device can be used to power a co-located sensing device as part of a sensored cable accessory.

In a further alternative, piezoelectric transducers can be utilized to convert the mechanical vibration found within enclosure 10 to electrical energy that can be stored in batteries or super capacitors. For example, a conventional piezoelectric transducer is available from Mide (www.mide.com). In another aspect, thermoelectric transducers can be utilized to convert the natural temperature differential between above ground and below ground to electrical energy. For example, see (http://www.idtechex.com/research/reports/thermoelectric-energy-harvesting-2012-2022-devices-applications-opportunities-000317.asp). In a further aspect, solar panels can be employed for trickle powering a battery or other internal components.

Optionally, the FCI detection system 100 may also include a power protection unit 160, which is coupled to the power source for the enclosure 10. The power protection unit 160 provides protection against current or overvoltage events that may occur during installation.

Figure 2:
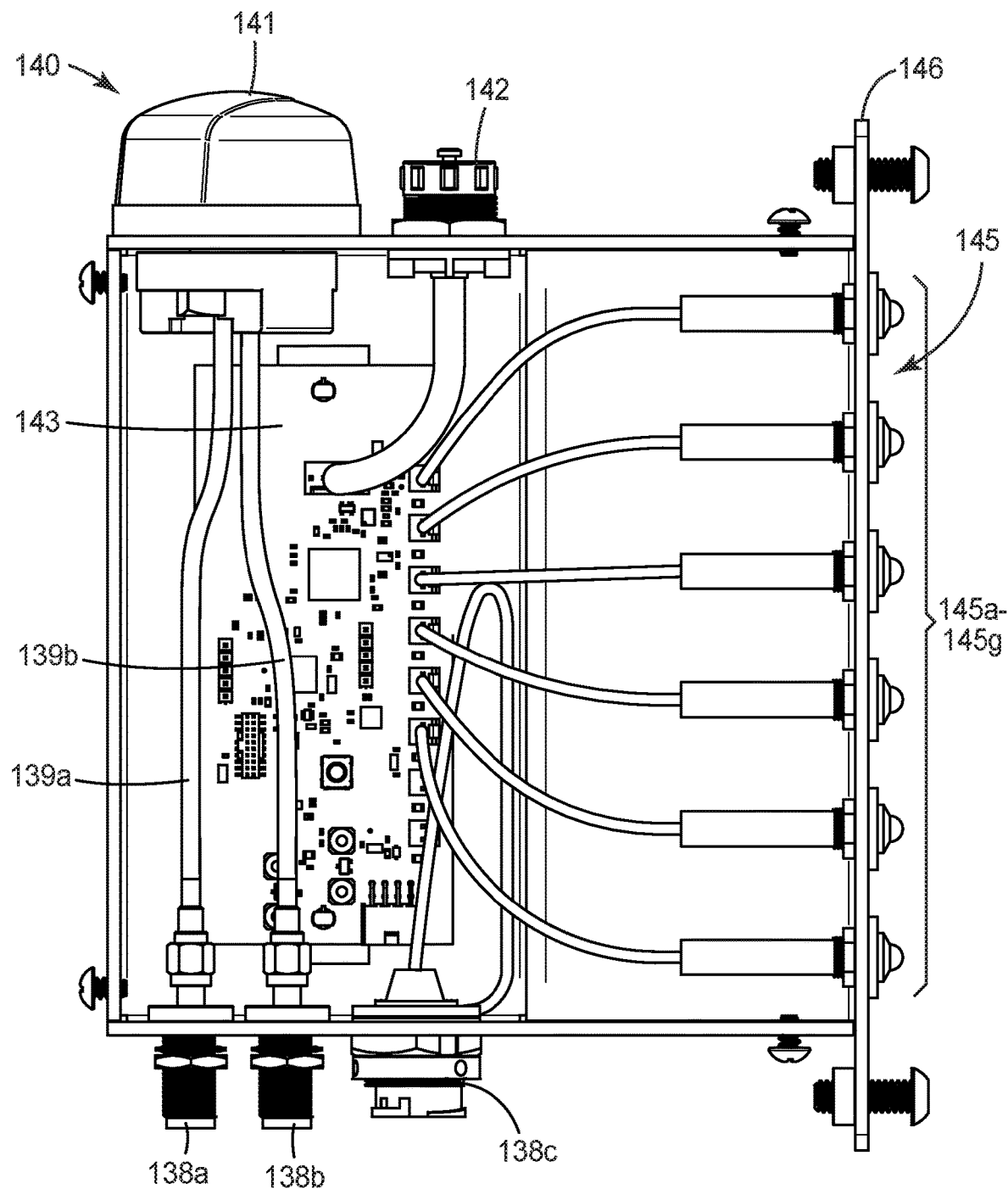
FIG. 2 is a partial schematic view of the transceiver portion of the fault circuit indicator detection system according to another aspect of the invention.

As mentioned above, the FCI detection system 100 further includes a transceiver unit 140 having a visual communication device or system 145. A more detailed view of the transceiver unit 140 is shown in FIG. 2.

The transceiver 140 includes a hardened antenna unit 141 that can include a communications antenna and a GPS antenna (not separately shown). In another aspect, multiple antennas can be embedded in the same housing (or housing portion) allowing for multiple communications methods both above and below ground. For example, WiFi and 4G antennas can be embedded in the same above ground antenna housing along with a GPS antenna to provide multiple network connections along with GPS positioning and timing (time stamping) information. A Bluetooth antenna can be embedded in the above ground housing to provide local communications to personnel in close proximity to the transceiver/gateway unit. For example, a craft person driving nearby a transceiver/gateway unit could directly read the sensors in the vault below using WIFI mesh. An RFID antenna can be embedded in the above ground housing to permit reading underground sensor data with an RFID reader.

In one aspect, the antenna unit 141 receives analyzed data signals from the SAU 120 via cable(s) 130, which couple to the transceiver unit 140 via couplings 138a, 138b. In this aspect, two data signal cables 139a, 139b connect to the hardened antenna 141. For example, cable 139a can carry an analyzed data signal from the SAU 120 to the antenna and cable 139b can carry a GPS signal (notifying the SCADA/network of the precise location of the enclosure). An exemplary remote data communication method is described in U.S. Pat. No. 9,961,418, incorporated by reference in its entirety.

In addition, a coupling 138c can be provided in the transceiver unit 140 to receive a visual communication drive signal from the SAU 120. This visual communication drive signal is received by visual communication driver board 143, which drives one or more of visual signal indicators 145, in this case LEDs 145a-145f, mounted on bracket 146. The visual communication signal can provide particular information, such as temporary or permanent fault information, including the identity of the faulty component or power line. For example, as shown in FIG. 2, six LEDs are provided, where each LED can identify a particular utility asset, such as a power line, by phase or other condition. In one aspect, the LEDs can comprise high intensity IP68 LEDs.

The driver board 143 can receive a fault classification signal and drive a particular visual indicator/LED, which would be observed by a nearby technician, such that the identity of the faulty component can be identified without having to enter the enclosure. This fault classification signal can correspond to the analyzed data signal transmitted to the SCADA or communications network, which would be received in the home office of the utility, or other central location. This visual communication signal can convey information such as power quality and incipient fault without an expensive investment in communication infrastructure.

In an alternative embodiment, instead of multiple LEDs (or other light sources), the visual signal indicator 145 can comprise a single LED (or other light source, such as a light pipe) that communicates a modulated signal via a conventional visible light communication technique. In this alternative example, a single LED based local FCI detection system can have an advantage over a multiple-LED based system in terms of cost and scalability. In addition, such a system can communicate more data than just a fault identity/location. For example, the visual indicator can convey power quality (PQ) data, overall system status information, and/or advanced analytics data such as waveforms. The communication can also be bidirectional. For example, although not shown, visual signal indicator 145 can further include an optical detector and associated circuitry, so that the system can receive data-carrying light information for applications such as remote firmware update, system debugging, etc.

In another alternative embodiment, the transceiver 140 can include a radio (which can be mounted on the driver board 143 or can be integrated within the antenna unit 141).

Alternatively, optionally, transceiver 140 can further include a USB port 142 to receive separate communications from an outside source, such as a technician. In this example, port 142 connects to board 143 via a dual bus (multiple communication and power) to receive a standard communication signal (e.g., a RS 422 signal) that can provide, e.g., a firmware update for the associated SAU 120.

Figure 3:
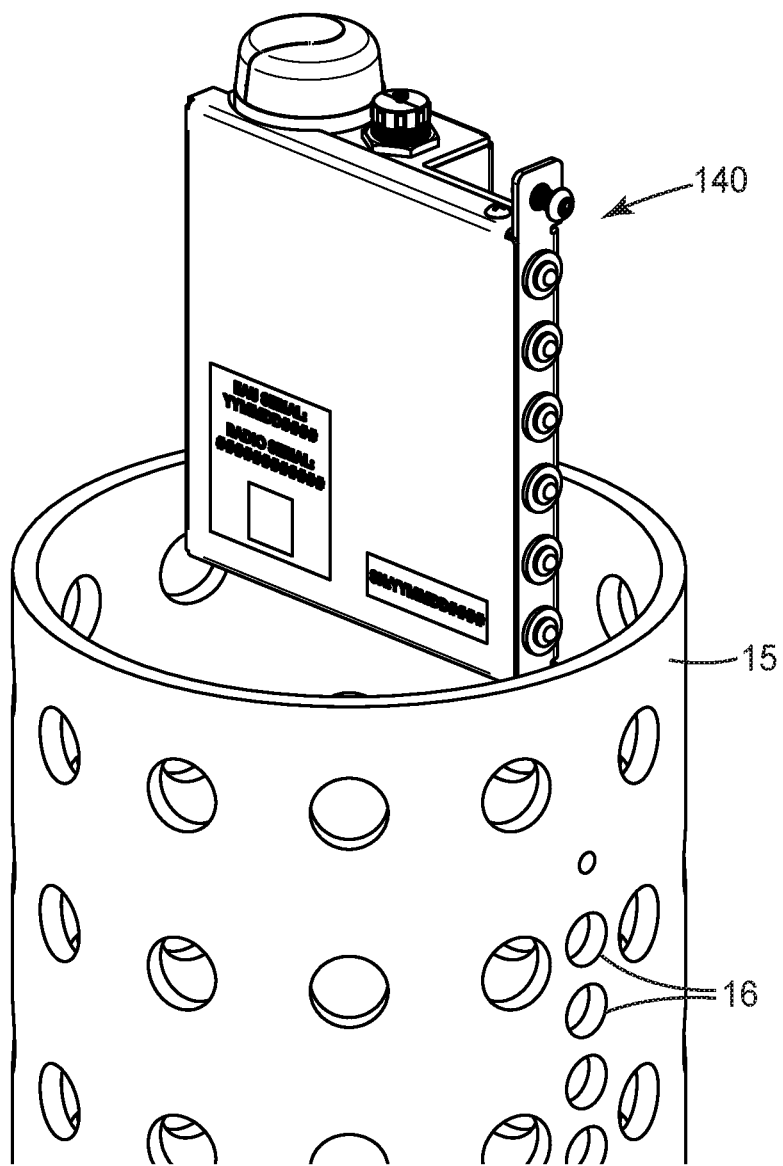
FIG. 3 is a partial isometric view of the transceiver portion of the fault circuit indicator detection system being installed in a vent pipe according to another aspect of the invention.

FIG. 3 shows a schematic view of a transceiver unit 140 being installed in a vent pipe 15. The vent pipe 15 can include a series of ventilation holes (not labeled) and can further include one or more openings 16 corresponding to the one or more visual indicators 145 included on transceiver unit 140. The transceiver 140 can be mounted to the interior region of vent pipe 15 via a conventional bracket or fasteners. The vent pipe 15 can be formed from a rigid material, such as a plastic or metal material.

Figure 4:
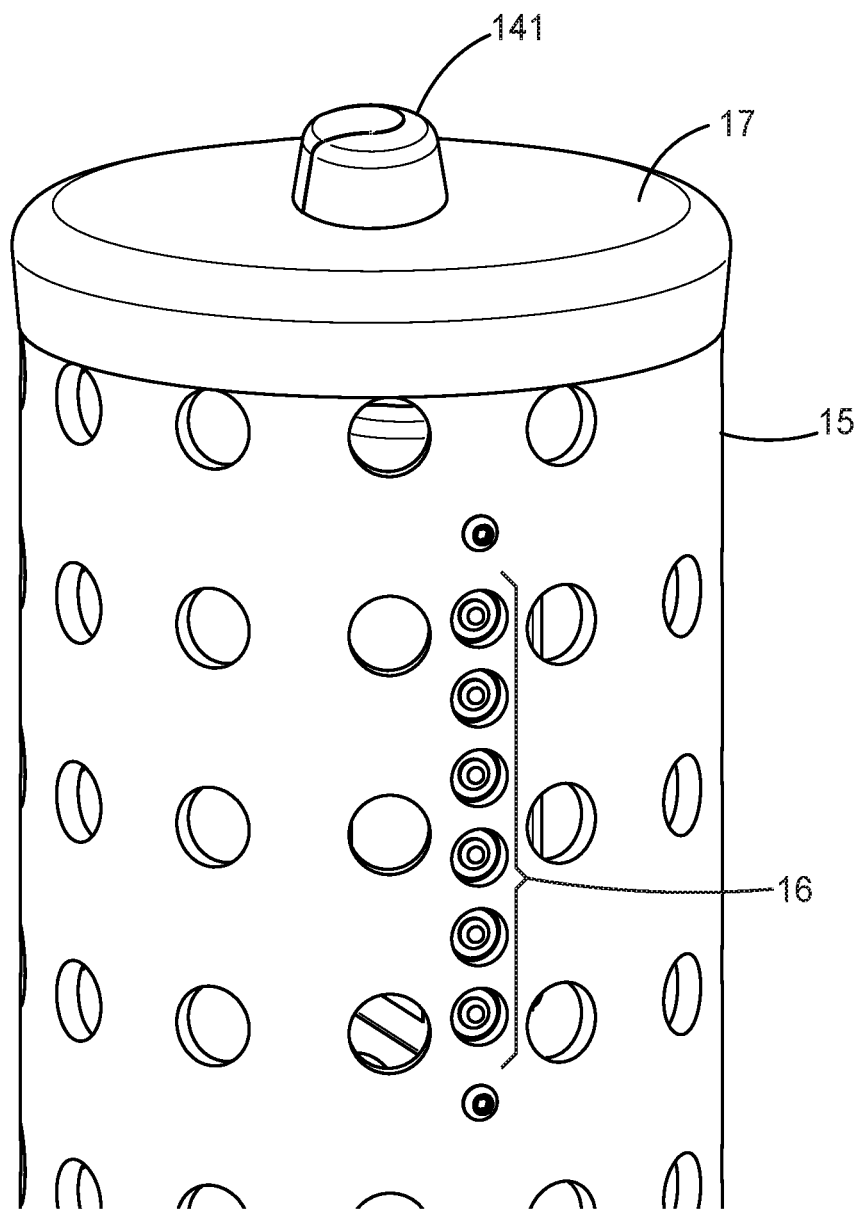
FIG. 4 is a partial isometric view of the transceiver portion of the fault circuit indicator detection system installed in a vent pipe according to another aspect of the invention.

In addition, as shown in FIG. 4, vent pipe 15 can include a cap 17 to cover an upper opening of the vent pipe. In one aspect, the cap 17 can include an opening to permit passage of the antenna unit 141 of transceiver unit 140. Alternatively, the transceiver 140 or integrated antenna unit 141 can be disposed inside or even flush mounted to the vent pipe cap 17.

In a further alternative aspect, the cap 17 can include a solar cell attached thereon that is coupled to the driver board 143 (e.g., to a capacitor bank installed on the driver board 143) to provide emergency power to the transceiver 140 in the event of an outage.

Thus, the FCI detection system can provide filtered and classified data to transceiver/visual indicator for communicating with a utility and/or a street utility technician/crew. The mechanical assembly can house different communication protocols, traffic monitoring, various environmental/structural sensors, and can also house camera systems/technologies for security and surveillance applications. With this construction, if a sensor senses a line fault, the system can communicate real-time fault location information to a power utility network/SCADA system and technician instantly, allowing the utility company to accurately pinpoint an underground fault location, thus saving the time and expense of entering and physically inspecting a multitude of vault locations within the grid. In addition, performing the appropriate local actions can quickly restore service to customers and prevent further damage to the grid itself.

As mentioned above, although not shown, the FCI detection system can be implemented in an above-ground environment, such as a pad mounted cabinet or enclosure, or an overhead pole mounted cabinet. For example, grade-level or above ground devices that can utilize one or more of these FCI detection systems include, e.g., power or distribution transformers, motors, switch gear, capacitor banks, and generators.

The present invention has now been described with reference to several individual embodiments. The foregoing detailed description has been given for clarity of understanding only. No unnecessary limitations are to be understood or taken from it. All references to right, left, front, rear, up and down as well as references to directions are exemplary only and do not limit the claimed invention. It will be apparent to those persons skilled in the art that many changes can be made in the embodiments described without departing from the scope of the invention. Thus, the scope of the present invention should not be limited to the details and structures described herein, but rather by the structures described by the language of the claims, and the equivalents of those structures.

The invention claimed is:

1. A fault circuit indicator (FCI) detection system for electrical equipment disposed in an enclosure or vault having an above-ground vent pipe exhaust outlet, comprising:
   one or more sensors disposed in the enclosure or vault to sense a condition of at least one unit of the electrical equipment;
   a sensor analytics unit (SAU) coupled to the sensors to receive sensor data and analyze the sensor data, the SAU generating a corresponding analyzed data signal that provides information related to a condition of the at least one unit of electrical equipment;
   a transceiver disposed inside at least a portion of the vent pipe to receive the analyzed data signal, wherein the transceiver is configured to communicate the analyzed data signal; and
   a visual indicator disposed on or within the vent pipe comprising one or more visual indicators driven by a driving circuit board to provide a visual signal corresponding to the condition of the at least one unit of electrical equipment.

2. The FCI detection system of claim 1, wherein the one or more sensors detect at least one of: power, voltage, current, temperature, combustible materials or byproducts of combustion, mechanical strain, mechanical movement, humidity, soil condition, pressure, hazardous atmosphere, liquid flow, leakage, component end-of-life or lifetime, personnel presence, physical state, light level, and vibration.

3. The FCI detection system of claim 1, wherein at least one sensor is incorporated in a sensored cable accessory and is configured to monitor a condition of a power cable.

4. The FCI detection system of claim 1, wherein the transceiver includes a communications gateway unit.

5. The FCI detection system of claim 1, wherein the sensor analytics unit includes a digital signal processor.

6. The FCI detection system of claim 1, wherein the sensor analytics unit includes a wireless network communications chip.

7. The FCI detection system of claim 1, wherein the transceiver unit includes a hardened above ground antenna and, optionally, a radio.

8. The FCI detection system of claim 1, wherein the transceiver is configured to send aggregated information upstream to another aggregation node or cloud server above ground.

9. The FCI detection system of claim 8, wherein the aggregated data comprises one or more of periodic status notification and asynchronous alarm notification.

10. The FCI detection system of claim 1, wherein the transceiver is configured to respond to messages sent to it by an upstream aggregation node or cloud.

11. The FCI detection system of claim 1, wherein the enclosure or vault comprises an underground enclosure and wherein the entrance port comprises a manhole cover and a ring portion to receive the manhole cover.

12. The FCI detection system of claim 1, further comprising a power harvesting device coupled to at least one power line located in the enclosure.

13. The FCI detection system of claim 12, wherein the power harvesting device is coupled to and provides power to the sensor analytics unit.

14. The FCI detection system of claim 1, wherein the sensor analytics unit contains a plurality of interface ports configured to connect to one or more environmental sensors.

15. The FCI detection system of claim 1, wherein the transceiver is powered via inductive coupling.

16. The FCI detection system of claim 1, wherein the visual indicators comprise a plurality of LEDs.

17. The FCI detection system of claim 1, wherein the one or more visual indicators comprises a single LED communicating via a visible light communication protocol.

18. The FCI detection system of claim 1, wherein the vent pipe includes a cap, and wherein a hardened antenna of the transceiver is disposed through an opening of the cap.

19. The FCI detection system of claim 1, wherein the transceiver includes a GPS antenna, and wherein the SAU generates a GPS data signal that is transmitted via the GPS antenna.

20. The FCI detection system of claim 1, wherein the enclosure or vault comprises an above-ground or grade level enclosure.

* * * * *